(12) United States Patent
Tanaka

(10) Patent No.: US 8,407,406 B2
(45) Date of Patent: Mar. 26, 2013

(54) SEMICONDUCTOR MEMORY DEVICE AND METHOD OF TESTING THE SAME

(75) Inventor: Shuichi Tanaka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 131 days.

(21) Appl. No.: 12/880,715

(22) Filed: Sep. 13, 2010

(65) Prior Publication Data

US 2011/0161606 A1    Jun. 30, 2011

(30) Foreign Application Priority Data

Dec. 25, 2009   (JP) ................................ P2009-294253

(51) Int. Cl.
*G06F 12/00*        (2006.01)
(52) U.S. Cl. ....................................................... 711/103
(58) Field of Classification Search .................. None
See application file for complete search history.

(56) References Cited

U.S. PATENT DOCUMENTS

| | | | | |
|---|---|---|---|---|
| 5,594,689 | A * | 1/1997 | Kato | 365/185.09 |
| 5,822,256 | A * | 10/1998 | Bauer et al. | 365/200 |
| 7,050,343 | B2 * | 5/2006 | Kumar et al. | 365/201 |
| 2007/0165461 | A1 * | 7/2007 | Cornwell et al. | 365/185.33 |

FOREIGN PATENT DOCUMENTS

| | | |
|---|---|---|
| JP | 2002-117699 | 4/2002 |
| JP | 2008-4264 | 1/2008 |

* cited by examiner

*Primary Examiner* — Hiep Nguyen
(74) *Attorney, Agent, or Firm* — Oblon, Spivak, McClelland, Maier & Neustadt, L.L.P.

(57) ABSTRACT

According to one embodiment, a nonvolatile semiconductor memory device is disclosed. The semiconductor memory device can include a first memory cell array and a second memory cell array acting in parallel each other, the first memory cell array including a plurality of first blocks and the second memory cell array including a plurality of second blocks, and each of the blocks being an erase unit, a plurality of flag resistors configured to correspond to each of the first blocks and each of the second blocks, a flag data is capable of being written to the flag resistors by selecting block address, a control circuit reading out the flag data in the flag resistor corresponding to the first block and the flag data in the flag resistor corresponding to the second block in parallel fashion, a first counter resistor storing a counting value of the flag data in the flag resistors corresponding to the first blocks of the first memory cell array, and a second counter resistor storing a counting value of the flag data in the flag resistors corresponding to the second blocks of the second memory cell array.

12 Claims, 3 Drawing Sheets

SEMICONDUCTOR MEMORY DEVICE AND METHOD OF TESTING THE SAME

CROSS REFERENCE TO RELATED APPLICATION

This application is based upon and claims the benefit of priority from prior Japanese Patent Application No. 2009-294253, filed on Dec. 25, 2009, the entire contents of which are incorporated herein by reference.

FIELD

An exemplary embodiment described herein relates to a nonvolatile semiconductor memory device and a method of testing the nonvolatile semiconductor memory device.

BACKGROUND

Recently, a NAND-type flash memory has been well known as a nonvolatile semiconductor memory device having large memory capacitor and low price. In the NAND-type flash memory, a flag may be set for a block defect, while redundancy replace may not be carried out.

As one example for the above case, a NAND-type flash memory having a defective block flag register and a defective block number counter has been disclosed.

DETAILED DESCRIPTION

Figure 1:
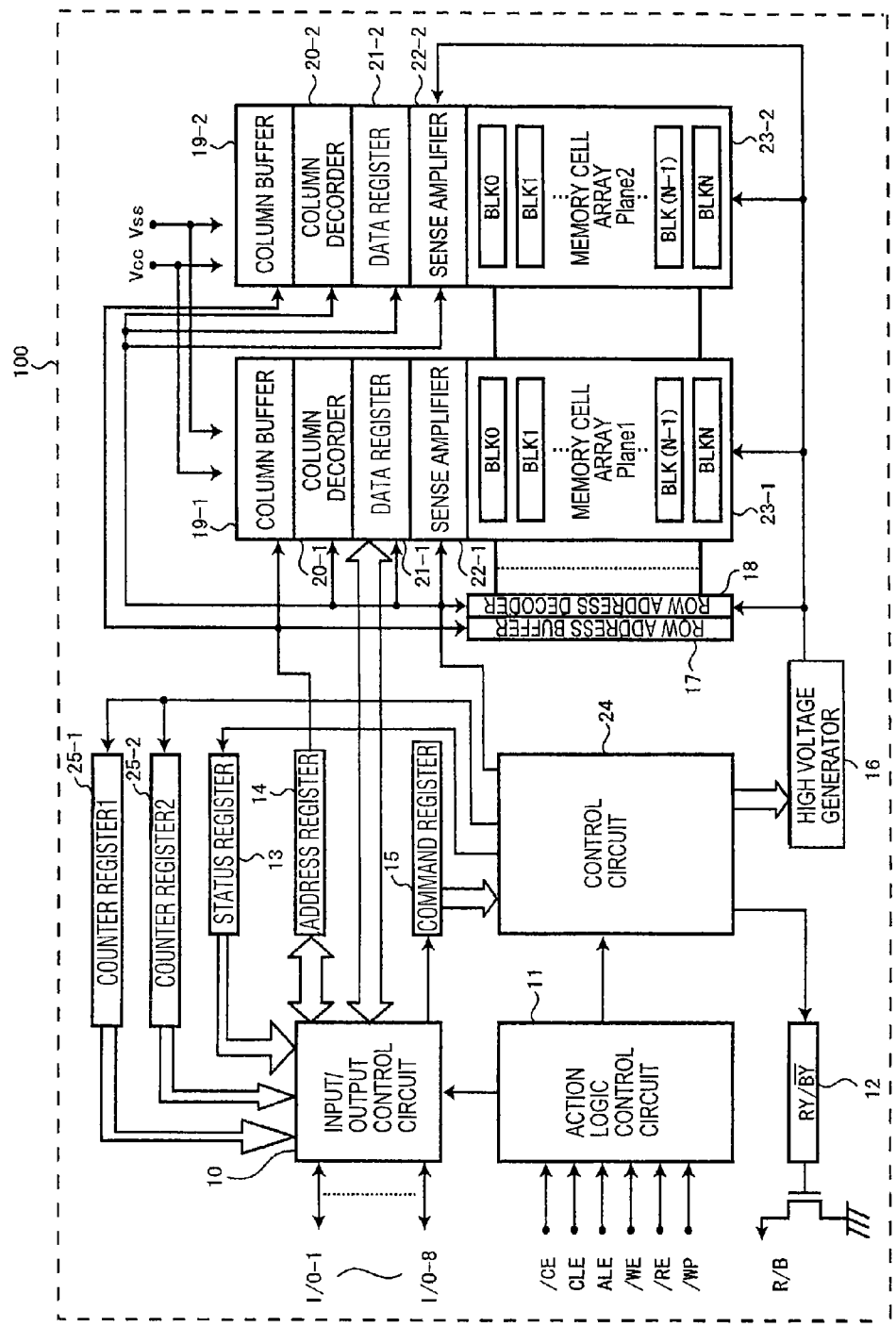
FIG. 1 is a block diagram showing a functional constitution of a NAND-type flash memory in an embodiment.

According to one embodiment, a nonvolatile semiconductor memory device is disclosed. The semiconductor memory device can include a first memory cell array and a second memory cell array acting in parallel each other, the first memory cell array including a plurality of first blocks and the second memory cell array including a plurality of second blocks, and each of the blocks being an erase unit, a plurality of flag registers configured to correspond to each of the first blocks and each of the second blocks, a flag data is capable of being written to the flag registers by selecting block address, a control circuit reading out the flag data in the flag register corresponding to the first block and the flag data in the flag register corresponding to the second block in parallel fashion, a first counter register storing a counting value of the flag data in the flag registers corresponding to the first blocks of the first memory cell array, and a second counter register storing a counting value of the flag data in the flag registers corresponding to the second blocks of the second memory cell array.

An embodiment will be described below in detail with reference to the attached drawings mentioned above.

Throughout the attached drawings, similar or same reference numerals show similar, equivalent or same components.

A NAND-type flash memory, for example, is explained as a nonvolatile semiconductor device according to an embodiment.

FIG. 1 is a block diagram showing a functional constitution of a NAND-type flash memory.

A NAND-type flash memory 100 includes an input/output control circuit 10, an action logic control circuit 11, a ready/busy control circuit 12, a status register 13, an address register 14, a command register 15, a high voltage generation circuit 16, a row address buffer 17, a row address decoder 18, a column address buffers 19-1, 19-2, column address decoders 20-1, 20-2, data registers 21-1, 21-2, sense amplifiers 22-1, 22-2, a memory cell array (panel1) 23-1, a memory cell array (panel2) 23-2, a control circuit 24, counter registers 25-1, 25-2.

When separation of the both of the components is not necessary in the described above, the column address buffers 19-1, 19-2, the column address decoders 20-1, 20-2, the data registers 21-1, 21-2, the sense amplifiers 22-1, 22-2, the memory cell arrays 23-1, 23-2, the counter registers 25-1, 25-2 are respectively called as the column address buffer 19, the column address decoder 20, the data register 21, the sense amplifier 22, the memory cell array 23, counter register 25 hereafter. Further, each memory cell array may be called a plane.

The input/output control circuit 10 controls transfer of commands and addresses input through eight input/output terminals I/O1-I/O8. Further, the input/output control circuit 10 controls data input/output through the eight input/output terminal I/O1-I/O8. Input write command, read command, erase command, status read command are included as the command, for example.

The action logic control circuit 11 is received a kind of control signals input from an external apparatus. For example, the action logic control circuit 11 is received a chip enable signal /CE, an address latch enable signal ALE, a command chip enable signal CLE, a write enable signal /WE, a read enable signal /RE, and a write protect signal /WP to control the input/output control circuit 10 and the control circuit 24 on the basis of combination of each signal.

The ready/busy control circuit 12 outputs a ready/busy signal from a ready/busy terminal control on the basis of action states of the circuit 24 such as each action state of write, read, erase or the like. For example, a signal level in the ready/busy terminal is "Low" during the NAND-type flash memory 100 continues to act write, read, erase or the like in the circuit. On the other hand, the signal level in the ready/busy terminal is shifted to "High", when the action is finished.

The status register 13 is controlled by the control circuit 24. The status register 13 is loaded information corresponded to pass or fail of the action of write, read, erase or the like in the NAND-type flash memory to temporally retain the information. The pass means that the executed action is normally finished and the fail means the executed action is normally not finished. Further, the status register 13 temporally stores the judge of the pass or the fail in a multiple selection sense process mentioned after. At least a part of the information retained in the status register 13 can be output out of the NAND-type flash memory 100 in correspondence with an input of the status read command.

The address register 14 temporally stores addresses input through the input/output control circuit 10 to transfer row addresses to the row address buffer 17 and column addresses to the column address buffer 19.

The command register 15 temporally stores commands such as write command, read command, erase command or status read command input through the input/output control circuit 10 to transfer the control circuit 24.

The high voltage generation circuit 16 generates high voltage which is necessary in each action such as write, read, erase or the like, on the basis of the state of the control circuit 24 to transfer the row address decoder 18, the sense amplifier 22 and the memory cell array 23.

The row address buffer 17 temporally stores row addresses input through the address register 14 to transfer the row address decoder 18.

The row address decoder 18 controls word lines on the basis of the row addresses input through the row address buffer 17 and applies voltage to the word lines in the write action and the read action.

The column address buffer 19 temporally stores column addresses input through the address register 14, transfer the column addresses to the column address decoder 20.

The column address decoder 20 controls bit lines on the basis of column addresses input through the column address buffer 19 and selectively applies voltage to the bit lines in the write action and the read action.

The data register 21 temporally stores constant amount of write data through the input/output control circuit 10 or constant amount of read data determined by the sense amplifier 22.

The sense amplifier 22 determines and amplifies data read from the memory cell array 23. The sense amplifier includes, for example, sense amplification circuits, each sense amplify circuit corresponding to each bit line.

The memory cell array 23 includes a structure in which a plurality of memory cell transistor are configured as a matrix. The memory cell transistor retains binary value data or multiple value data by a threshold voltage difference in transistors, the threshold voltage being determined by charge amount stored in a floating gate of the transistor, for example. On the other hand, the memory cell transistor may have an MONOS structure which capture electric charges in a silicon nitride film as a charge accumulation layer.

Here, the NAND-type flash memory 100 in this embodiment includes two planes 23-1, 23-2 (Plane 1 and Plane 2) therein. Each of the planes 23-1, 23-2 can be acted in parallel fashion, therefore, at least each of the planes 23-1, 23-2 includes each of the column address buffers 19-1, 19-2, column address decoders 20-1, 20-2, the data registers 21-1, 21-2, and the sense amplifiers 22-1, 22-2, respectively.

Each of the two planes 23-1 is configured to be composed of a plurality of blocks BLK0, BLK1 . . . and BLKN as an erase unit. In this embodiment, two of the planes 23-1, 23-2 includes the same number of the blocks each other. Each block is configured to be composed of a plurality of pages as a write unit and a read unit. Each page, for example, is defined as a group of the memory cells connected to the same word line.

The control circuit 24 controls the ready/busy control circuit 12, the status register 13, the high voltage generation circuit 16, the row address decoder 18, the column address decoder 20, the data register 21 and the sense amplifier 22 on the basis of commands input from the input/output control circuit 10 and each control signal input from the action logic control circuit 11 to execute inner actions such as write, read, erase or the like.

Further, the control circuit 24 controls the counter register 25 and automatically execute a prescribed test process in the NAND-type flash memory 100 on the basis of test-mode commands input from an external tester as a test process mentioned after. As a result, the control circuit 24 outputs the judge, pass or fail, to the outer tester. The control circuit 24 has a function of a built in self test (BIST) which is carried out by the process as mentioned above.

The counter register 25 is used for counting a defective block number in the test process of the NAND-type flash memory. Further, the counter register 25 is used for a block multiple selection by a defect of the row address decoder 18 in a multiple selection sense process mentioned after. In this embodiment, the counter register 25-1 is configured corresponding to the plane 23-1 and the counter register 25-2 is configured corresponding to the plane 23-2.

In other words, the counter register 25-1 is used in a case that the defective block number is counted on each block in the plane 23-1 and is used in a case that the block multiple selection is sensed in the plane 23-1 or between the plane 23-1 and the plane 23-2. Further, the counter register 25-2 is used in a case that the defective block number is counted on each block in the plane 23-2 and is used in a case that the block multiple selection is sensed in the plane 23-2 or between the plane 23-1 and the plane 23-2.

Figure 2:
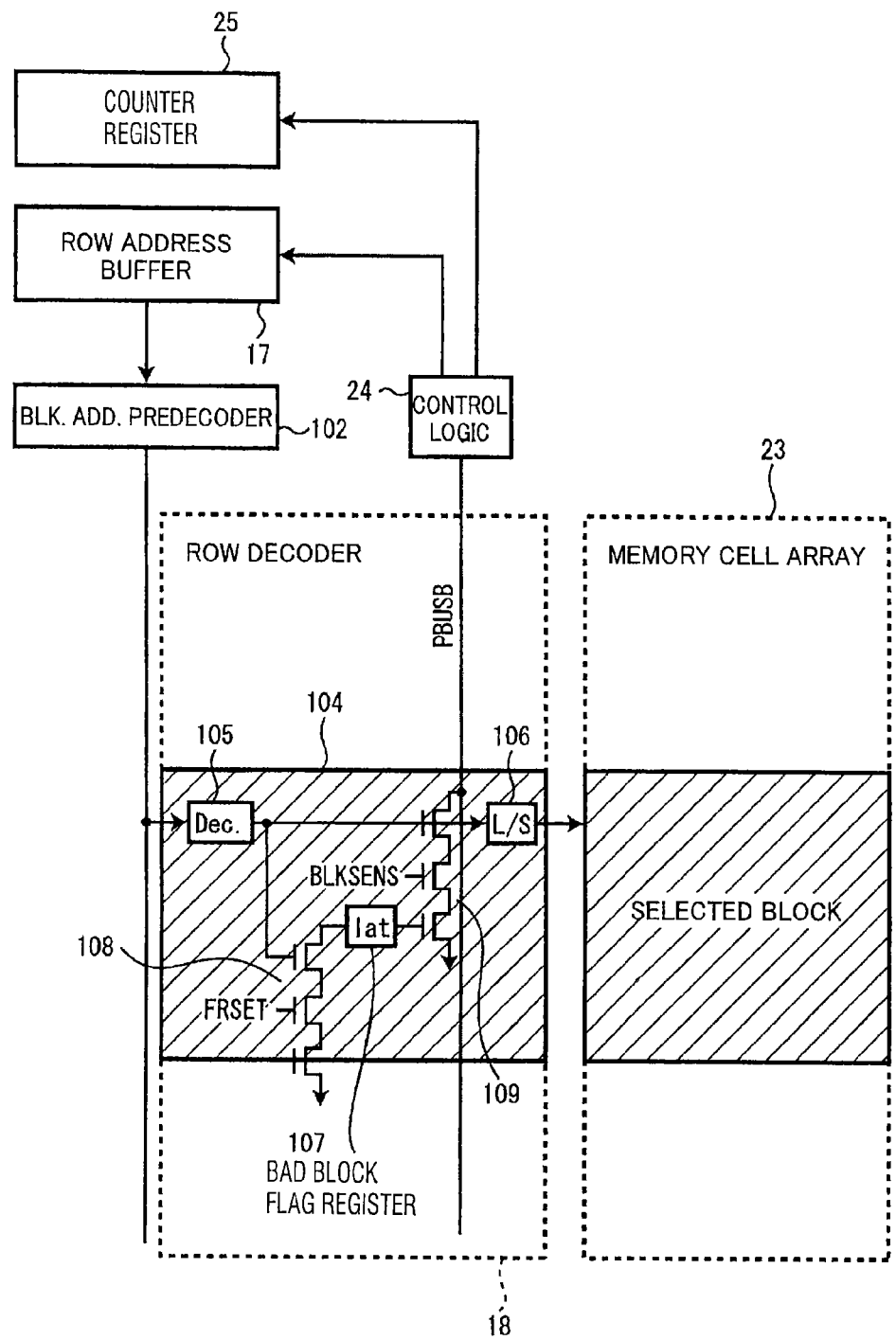
FIG. 2 is a block diagram showing a circuit configuration in relation to defective block sensing system in the embodiment.

FIG. 2 is a block diagram showing a circuit configuration in relation to a defective block sensing system in the embodiment. In FIG. 2, similar, equivalent or same components in FIG. 1 are shown as similar or same reference numerals in FIG. 1.

The defective block sensing system as shown in FIG. 2 includes a counter register 25, a row address buffer 17, block address pre-decoder 102 decoding output of the row address buffer 17 and a control circuit 24 sensing signals of a wiring PBUSB and a wiring PBUSB.

In the row address decoder 18, a number of partial decoder circuits 104 corresponding to each block of the memory cell array 23 are configured. Each partial decoder circuit 104 includes a decoder circuit 105 decoding output of a block address pre-decoder 102, level shift circuit 106 performing a level conversion on output of the decoder circuit 105 and providing the converted output to a corresponding block, a defective block flag register 107, a set circuit 108 composed of two N-channel MOS transistors serially connected for setting the defective block flag register 107 on the basis of the output of the decoder circuit 105 and flag register set signals FRSET, read circuit 109 composed of three N-channel transistors serially connected for reading a subject of the defective block flag register 107 to a wiring PBUSB on the basis of the output of the decoder circuit 105 and register sense signals BLKSENS.

As a sequence sensing a defective block using the defective block sensing system is a conventional technique, called a defective block sensing process hereafter, the explanation of the process is omitted. The defective block sensed in the defective block sense process is written in a ROM fuse area which is a portion of the memory cell array 23. The defective block is loaded in a ROM fuse resistor (not shown) at power-on, successively a flag is set at a corresponding defective block flag register 107.

It is explained below whether the flag is set in the defective block flag register 107 corresponding to the selected block or not, namely the flag data are written in or not. A wiring PBUSB is preliminary pre-charged by the control circuit 24, subsequently, a block sense signal BLKSENS set to be "high". The sense can be obtained by the control circuit 24 where the wiring PBUSB is discharged or not. The counter register 25-1, 25-2 is incremented by repeating the action to sense total defective blocks in each plane 23-1, 23-2.

Here, multiple selection sense process in which a block multiple selection is carried out by a defect of the row address decoder 18 is used in a test process of a nonvolatile semiconductor memory device, for example, a NAND-type flash memory 100. The block multiple selection represents a defect that two or more blocks are selected by one block address. In the multiple selection sense process, the action executed in sensing the defective block is diverted. The flag data are sequentially written in the defective block flag register 107 corresponding to each block. Subsequently, the flag data in the plane composed of a plurality of blocks are sequentially counted.

Figure 3:
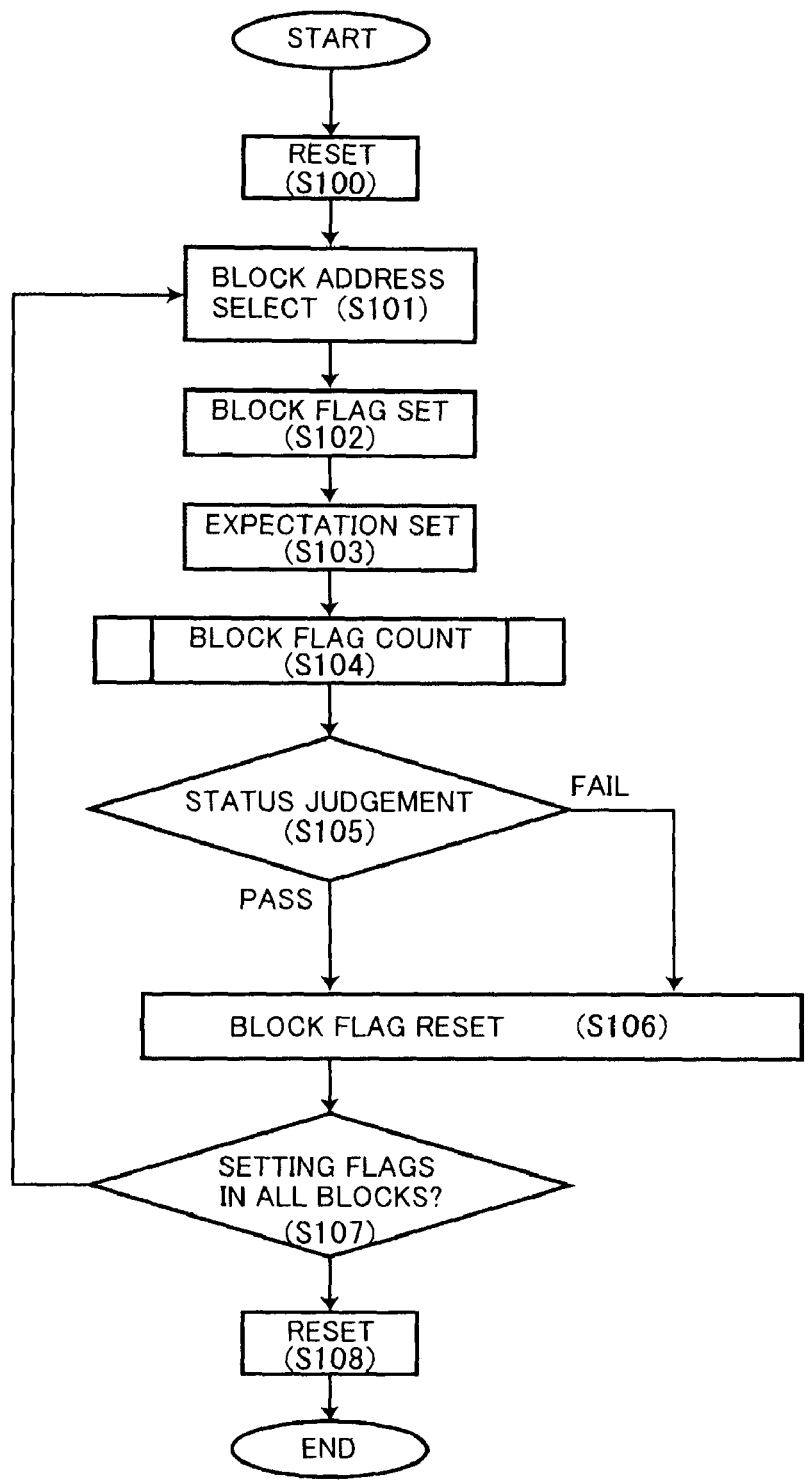
FIG. 3 is a flow chart showing a testing process of the NAND-type flash memory in the embodiment.

The multiple selection sense process is specifically described below as reference to FIG. 3. FIG. 3 is a flow chart showing a testing process of the NAND-type flash memory in the embodiment. In the flow chart, processing steps mentioned below is demonstrated as a counting process. The processing steps is composed of sequentially reading the flags of the all blocks in the plane 23-1 and storing the result to one counter register 25-1 read. Further, sensing the defective block is already finished and information of the defective block is stored in the ROM fuse in this case.

After starting the multiple selection sense process, the control circuit 24 executes an initializing action on the NAND-type flash memory 100 as a power-on action. The control circuit 24 reads the defective block information from the ROM fuse to the ROM fuse resistor and sets the defective block information in the defective block flag register 107. The action is carried out at the power-on. On the other hand, the flags in the defective block flag register 107 are all reset in the multiple selection sense process as utilizing the defective block flag register 107 (step S100).

Next, the control circuit 24 selects a block address in the blocks of the plane 23-1. When the test starts, the block address corresponding to the block 0, for example, is selected. In such a manner, the block address pre-decoder 102 activates the decoder circuit 105 (step S101).

Next, the control circuit 24 writes flag data into the defective block flag register 107 corresponding to the block selected by the block address. The flag data are set by setting a signal FRSET shown in FIG. 2 at "High" (step S102).

Next, the control circuit 24 sets an expectation value "1". An area in which the expectation value is set, for example, may be a general register prepared in the control circuit 24. The area is not especially restricted. Here, the expectation value "1" is defined as mentioned below. In a case that the row address decoder 18 has not a multiple selection defect, only one block is selected to set one flag when one block address is selected (step S103).

Next, the control circuit 24 sequentially counts the flag data retained in the defective block flag register 107 as to all blocks in the plane 23-1. The counting values are stored in the counter register 25-1. As mentioned above, when the row address decoder 18 has not the multiple selection defect, the counting value becomes "1" as the same as the expectation value. On the other hand, the row address decoder 18 has the multiple selection defect, two or more blocks are selected by one block address to result in the counting value more than "2". (step S104).

Next, the control circuit 24 determines whether the counting value is coincident to the expectation value or not. When the coincidence is obtained, "Pass" is stored in the status register 13 as a status. On the other hand, in a case that the coincidence is not obtained, "Fail" is stored in the status register 13 as the status. The status register 13 is continued to store "Fail" in being independent to the subsequent determinations after "Fail" is stored one time (step S105).

Next, the control circuit 24 stores "Pass" in the status register 13 as the status or stores "Fail" in the status register 13 as the status, subsequently, the control circuit 24 resets all the defective block flag register 107 in the plane 23-1 (step S106).

Next, the control circuit 24 determines whether flag setting actions are finished as to the all blocks in the plane 23-1 or not. When the flag setting actions are not finished to leave the blocks, the processing step return step S101 and the multiple selection sense process is continued. When the flag setting actions are finished as to the all blocks, the process goes to step S108 (step S107).

Next, the control circuit 24 outputs a status ("Pass/Fail") stored in the status register 13 in correspondence with the status read command to an outer tester or the like. As another case, the control circuit 24 executes to initialize the NAND-type flash memory 100 after executing an action of finishing the test in which the test value of the NAND-type flash memory is stored in a test value store portion or the like. When another test process as a BIST process is leaved, the test process is executed. When the test process is not leaved, the test process is finished (step S108).

The block multiple selection can be detected by the sequence mentioned above. As mentioned above, a technical feature in the NAND-type flash memory according to this embodiment is that the two counter registers 25-1, 25-2 are included therein. Further, the two planes 23-1, 23-2 independently include each peripheral circuit, for example, the sense amplifier 22 or the like. Therefore, the data stored in the defective block flag register 107 can be read out in parallel fashion in the two planes 23-1, 23-2. Accordingly, the multiple selection sense process can be to speed up as comparing with a case that the NAND-type flash memory prepares one counter register 25.

Further, a function in which the information stored in the defective block flag register 107 is counted to store in the counter register 25 is used in the NAND-type flash memory according to this embodiment. In the function, the block multiple selection sense process by the defect in the row address decoder 18 is executed. Consequently, a new test circuit as the multiple selection sense process for a special use is not necessary to configure in the NAND-type flash memory. As a result, the process in this embodiment has an advantage for shrinking the chip area. Further, as the counter register 25 is only added to shorten the test time, the test circuit can be added at minimum. Accordingly, the process in this embodiment has an advantage for shrinking the chip area.

Further, the multiple selection process in the same plane is explained in this embodiment. On the other hand, the method in this embodiment can be applied to a case of multiple selection process between different planes. For example, the case is mentioned below. A same number of the blocks in the plane 23-1 and the plane 23-2 by a defect of the row address decoder 18 are multiply selected. In other words, a block i (i=1–N) in the plane 23-1 is selected to write the flag data, another block i (i=1–N) in the plane 23-2 is simultaneously selected to write the flag data.

In such the case, the flag data on the planes 23-1, 23-2 can be read in parallel fashion to carry out multiple selection sense. Specifically, the block address selection is performed on the plane 23-1 from the block 0 to the block N in ascending order to write the flag data. On the other hand, the block address selection is performed on the plane 23-2 from the block N to the block 0 in descending order to write the flag data. In such a manner, a block erroneous selection by the multiple selection and a real block is not interposed. When the multiple selection defect is occurred, a count value of the plane flag data becomes larger than the expectation value, so that the method in this embodiment can be judged as the status "Fail".

Further, it is explained in this embodiment that the NAND-type flash memory prepares the two planes. On the other hand, a number of the plane is not restricted to two and more than three of the planes are also available. A constitution having counter resistors corresponding to each plane as the NAND-type flash memory can be obtained.

While a certain embodiment have been described, this embodiment has been presented by way of example only, and is not intended to limit the scope of the inventions. Indeed, the novel device and method described herein may be embodied in a variety of other forms; furthermore, various omissions, substitutions and changes in the form of the device and the method described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
    a first memory cell array and a second memory cell array acting in parallel to each other, the first memory cell array including a plurality of first blocks and the second memory cell array including a plurality of second blocks, and each of the blocks being an erase unit;
    a plurality of flag registers configured to correspond to each of the first blocks and each of the second blocks, flag data are capable of being written to the flag registers by selecting a block address;
    a control circuit reading out the flag data in the flag register corresponding to one of the first blocks and the flag data in the flag register corresponding to one of the second blocks in parallel fashion;
    a first counter register storing a first counting value of the flag data in the flag registers corresponding to the first blocks of the first memory cell array; and
    a second counter register storing a second counting value of the flag data in the flag registers corresponding to the second blocks of the second memory cell array.

2. The device of claim 1, wherein
    the control circuit writes defective block information into one of the flag registers.

3. The device of claim 1, wherein
    the control circuit outputs a status corresponding to the first counting value or the second counting value stored in the first counter register or stored in the second counter register to an external apparatus.

4. The device of claim 1, wherein
    the control circuit includes a register and sets an expectation value to the register.

5. The device of claim 3, wherein
    the control circuit determines that a multiple selection defect occurs when at least one of the first counting value and the second counting value is larger than an expectation value.

6. The device of claim 3, wherein
    the control circuit determines a multiple selection defect does not occur when at least one of the first counting value and the second counting value is the same as an expectation value.

7. The device of claim 5, further comprising;
    a status register being controlled by the control circuit and storing information indicating whether or not the multiple selection defect occurs.

8. The device of claim 5, wherein
    the control circuit outputs the information stored in the status register to the external apparatus.

9. A method of testing a nonvolatile semiconductor memory device, comprising:
    selecting each first block and each second block from a plurality of first blocks in a first memory cell array and a plurality of second blocks in a second memory cell array, respectively, according to a block address, each of the blocks being an erase unit;
    writing flag data into a first flag register and a second flag register corresponding to a first block and a second block, respectively;
    sequentially reading the flag data in the first flag register corresponding to the first block in the first memory cell array;
    sequentially reading the flag data in the second flag register corresponding to the second block in the second memory cell array in parallel with reading the flag data in the first flag register;
    comparing a counting value of the flag data with an expectation value;
    determining as occurrence of a multiple selection defect when the counting value is larger than the expectation value and as not generating the multiple selection defect when the counting value is the same as the expectation value.

10. The method of claim 9, further comprising;
    storing the counting value in a status register before determining the occurrence of the multiple selection defect.

11. The method of claim 9, further comprising;
    outputting the determination of the multiple selection defect to an external apparatus as a status after determining the occurrence of the multiple selection defect.

12. The method of claim 9, wherein
    the flag data of one of the first blocks are written into the first flag register in ascending order or in descending order, the flag data of one of the second blocks are written into the second flag register in the opposite order to the order of the first flag register.

* * * * *